United States Patent [19]

Kim

[11] Patent Number: 5,515,331

[45] Date of Patent: May 7, 1996

[54] DRAM REFRESH CONTROL CIRCUIT

[75] Inventor: Young-Ho Kim, Kyunggi, Rep. of Korea

[73] Assignee: Gold Star Electron Co., Ltd., Chungcheongbuk, Rep. of Korea

[21] Appl. No.: 368,164

[22] Filed: Jan. 3, 1995

[30] Foreign Application Priority Data

Mar. 12, 1994 [KR] Rep. of Korea .................. 94-4899

[51] Int. Cl.[6] ................................................. G11C 7/00
[52] U.S. Cl. ............................................ 365/222; 365/233
[58] Field of Search .................................... 365/222, 205, 365/193, 233, 236, 189.25

[56] References Cited

U.S. PATENT DOCUMENTS

| | | | |
|---|---|---|---|
| 4,158,883 | 6/1979 | Kadano et al. | 365/222 |
| 4,207,618 | 6/1980 | White, Jr. et al. | 365/222 |
| 4,296,480 | 10/1981 | Eatson, Jr. et al. | 365/222 |
| 4,716,551 | 12/1987 | Inagaki | 365/222 |
| 5,343,430 | 8/1994 | Furuyama | 365/222 |
| 5,400,290 | 3/1995 | Suma | 365/233 |

*Primary Examiner*—David C. Nelms
*Assistant Examiner*—A. Zarabian
*Attorney, Agent, or Firm*—Finnegan, Henderson, Farabow, Garrett & Dunner

[57] ABSTRACT

A control circuit for refreshing a dynamic random access memory (DRAM) having a plurality of memory cells arranged in rows and columns. The inventive refresh control circuit includes a first circuit for detecting whether a first refresh mode exists in response to row and column address signals applied thereto and for generating a first output signal based on the result of the detection; a second circuit for detecting whether a second refresh mode exists in response to row and column address signals applied thereto and for generating a second output signal based on the result of the detection; a third circuit for detecting whether a reset condition exists in response to row and column address signals applied thereto and for generating a reset signal based on the result of the detection; and a counter circuit, coupled to the first, second, and third detecting circuits, for generating a count value representing a refresh address in response to the first and second output signals and the reset signal.

11 Claims, 5 Drawing Sheets

DRAM REFRESH CONTROL CIRCUIT

FIELD OF THE INVENTION

The present invention relates to a DRAM refresh control circuit.

BACKGROUND OF THE INVENTION

In a DRAM (dynamic random access memory), capacitors are used to store data in the cell, and therefore, the capacitors have to be refreshed to preserve the cell data. There are several methods for refreshing such DRAM cells.

For example, the RAS(row address strobe) Only Refreshing method (more popularly known as "ROR") refreshes the cells by changing only RAS signals while keeping CAS (column address strobe) signals constant at a high level. This ROR method has disadvantages in that addresses have to be externally provided during refresh operations, and address buses cannot be used for other purposes during refresh operations.

There is another refresh method known as "CBR" (CAS Before RAS). When memory cells are accessed during normal operations, generally RAS signals are changed before CAS signals are. In this CBR refresh method, to recognize a refresh mode, CAS signals are changed before RAS signals are, thus allowing refresh operations to be carried out under the refresh mode. This CBR refresh method also has disadvantages in that to generate addresses within the DRAM, an internal refresh counter can not be externally controlled.

FIG. 1 shows such a CBR refresh detecting circuit, and FIG. 2 shows such a refresh counter. This CBR refresh detecting circuit includes an invertor I1 for receiving RAS signals externally provided thereto; an invertor I2 for receiving the output of the invertor I1; and an invertor I3 for receiving CAS signals externally provided thereto. The detecting circuit further includes a transmission gate TS1, i.e., basically a switch composed of a PMOS transistor and an NMOS transistor connected in parallel. The gate of the PMOS transistor receives the output of the invertor I1, while the gate of the NMOS transistor receives the output of the invertor I2. The input of TS1 is connected to the side of the invertor I3, and the output of TS1 is connected to the input of a latch I4.

Under the refresh mode, refreshing is carried out by generating addresses from a counter provided within the DRAM. The latch I4 and a latch I5 jointly constitutes a latch, and a 2-input NOR gate NR1 receives the output of the invertor I2 on one input and the output of the latch I4 on the other, and outputs CBR signals.

Referring to FIG. 2, the refresh counter is composed of a plurality of T type flip-flops (T-F/Fs) connected in cascade. The first stage T-F/F of the refresh counter receives the CBR signal as a clock signal, and each subsequent stage T-F/F uses an inverted output QB of the preceding stage as a clock signal. A non-inverted output Q of each stage of the refresh counter, i.e., A0, A1, ... An–2, and An–1, is provided to an address buffer to serve as a refresh address when the refresh control circuit is under the CBR refresh mode.

FIG. 3 is a timing chart associated with the operation of the CBR refresh detecting circuit of FIG. 1. Suppose that the RAS signal, which is externally provided to the invertor I1, is high, then the output of the invertor I1 becomes low. Likewise, suppose that the CAS signal is high, then the output of the invertor I3 becomes low. Then the NMOS gate (the output of the invertor I2) of TS1 becomes high, and the PMOS gate (the input of the invertor I1) becomes low, thereby activating (or turning on) TS1. Therefore, the output of TS1 becomes low (same as the output of the invertor I3), and the output of the latch I4 becomes high, and consequently the CBR signal becomes low.

When the refresh control circuit is not under the CBR refresh mode, the RAS signal becomes low before the CAS signal does. Then, the output of the invertor I1 becomes high, and the output of the invertor I2 becomes low. Consequently, TS1 is turned off, and the latches I4 and I5 form a latch, and the output of the latch I4 consequently stays high, thereby making the CBR signal stay low.

When it is under the CBR refresh mode, the CAS signal becomes low before the RAS signal does. Accordingly, TS1 is turned on, the output of the invertor I3 is shifted to high, while the output of the latch I4 is shifted to low to latch. When the RAS signal subsequently becomes low, TS1 is turned off, and the output of the invertor I2 becomes low. Therefore, the CBR signal becomes high. The RAS signal becomes high and stays high until the output of the invertor I2 becomes high.

FIG. 4 is a timing chart associated with the operation of the refresh counter of FIG. 2. T-F/Fs reverse the signal state of the non-inverted output Q when the clock is shifted from low to high. Suppose that the initial state of the output of each T-F/F is set to low. Then, if the CBR signals are shifted from low to high, the output Q of the first stage T-F/F of the counter is shifted from low to high. If the CBR signal is shifted in the sequence of high→low→high, then the output Q of the first stage T-F/F is shifted from high to low, and the output QB is shifted from low to high.

When the CBR signal is shifted in the above sequence repeatedly, the first stage T-F/F repeats the shifting sequence of low→high→low→high, and since the second stage T-F/F uses the output QB of the first stage (i.e., QB of the first stage repeats the sequence of high→low→high→low), when the output QB of the first stage is shifted from low to high, the output Q of the second stage is shifted from low to high. In this manner, the refresh counter operates as a ripple counter.

Of the above described conventional refresh methods, in the CBR refresh method, the internal address counter can not be externally controlled, i.e., can not be reset to an arbitrarily selected value, and therefore, the CBR refresh method can not be used in conjunction with the ROR refresh method. Further, in the ROR refresh method, address buses can not used for other purposes during the refresh operation.

SUMMARY OF THE INVENTION

The object of the present invention is to overcome these problems and disadvantages of the conventional refresh methods.

To achieve this and other objects of the present invention, the control circuit for refreshing a dynamic random access memory (DRAM) having a plurality of memory cells arranged in rows and columns of the present invention, as embodied and broadly described herein, comprises a first means for detecting whether a first refresh mode exists in response to a row address signal (RAS) and a column address signal (CAS) applied thereto and for generating a first output signal based on the result of the detection; a second means for detecting whether a second refresh mode exists in response to a row address signal (RAS) and a column address signal (CAS) applied thereto and for generating a second output signal based on the result of the detection; a third means for detecting whether a reset condition exists in response to a row address signal (RAS) and a column address signal (CAS) applied thereto and for generating a reset signal based on the result of the detection; and a counter means, coupled to the first, second, and third detecting means, for generating a count value representing a refresh address in response to the first and second output signals and the reset signal.

According to another aspect of the present invention, the method for controlling the refresh of a dynamic random access memory (DRAM) having a plurality of memory cells arranged in rows and columns of the present invention comprises the steps of detecting whether a first refresh mode exists in response to a row address signal (RAS) and a column address signal (CAS) and generating a first output signal based on the result of the detection; detecting whether a second refresh mode exists in response to a row address signal (RAS) and a column address signal (CAS) and generating a second output signal based on the result of the detection; detecting whether a reset condition exists in response to a row address signal (RAS) and a column address signal (CAS) and generating a reset signal based on the result of the detection; and counting a value representing a refresh address in accordance with the first and second output signals and the reset signal.

The objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

The accompanying drawings, which are incorporated in and constitute a part of this specification, illustrate one embodiment of the invention and together with the description, serve to explain the principles of the invention.

DESCRIPTION OF THE PREFERRED EMBODIMENT

Reference will now be made in detail to the preferred embodiment of the invention, an example of which is illustrated in the accompanying drawings. Wherever possible, the same reference numbers will be used throughout the drawings to refer to the same or like parts.

Figure 1:
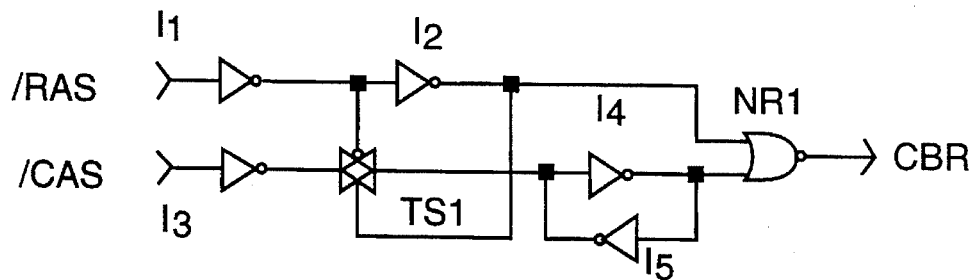
FIG. 1 shows a conventional CBR refresh detecting circuit.
Figure 2:
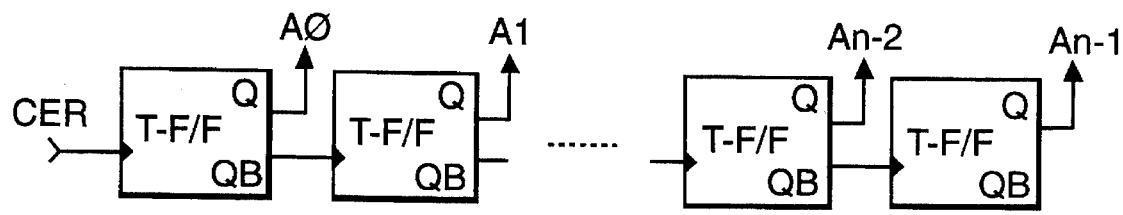
FIG. 2 shows a conventional refresh counter.
Figure 3:
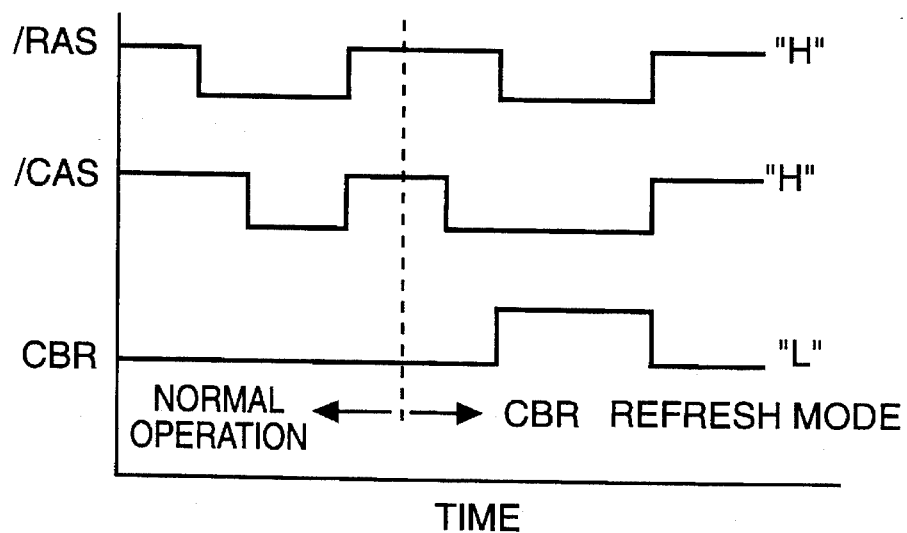
FIG. 3 is a timing chart associated with the operation of the CBR refresh detecting circuit of FIG. 1.
Figure 4:
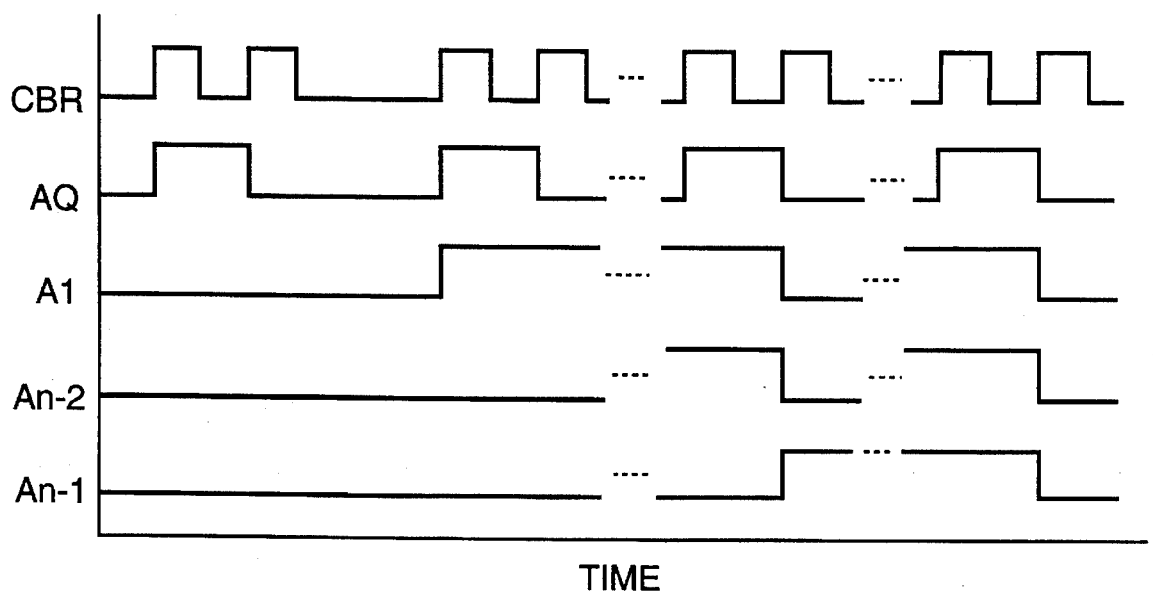
FIG. 4 is a timing chart associated with the operation of the refresh counter of FIG. 2.
Figure 5:
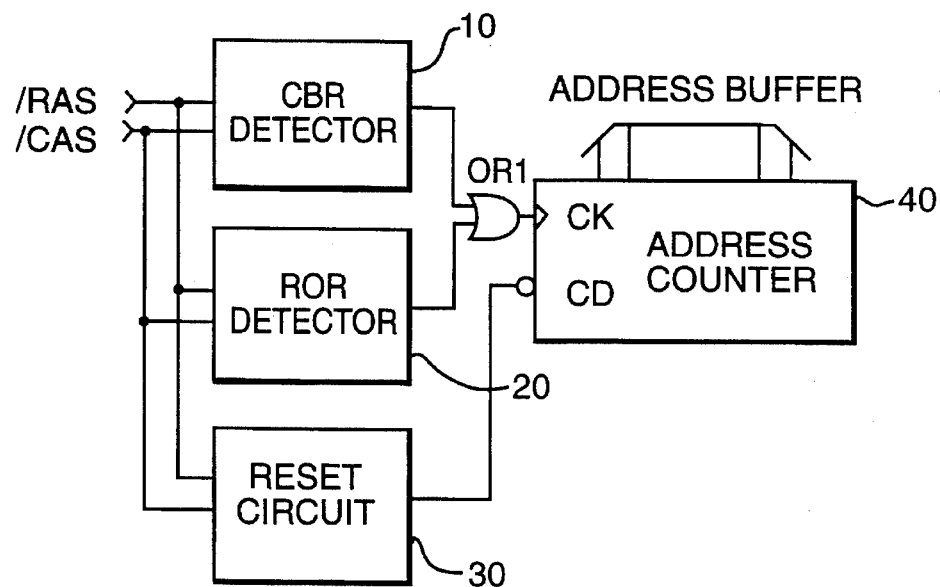
FIG. 5 is a block diagram of the DRAM refresh control circuit according to an embodiment of the present invention.

FIG. 5 shows a block diagram of the DRAM refresh control circuit according to an embodiment of the present invention. The DRAM refresh control circuit, as embodied herein, refreshes DRAM cell data with CAS signals and RAS signals, and includes a CBR (refresh) detector 10 for detecting a CBR refresh mode to generate a CBR signal; a ROR detector 20 for detecting a ROR refresh mode to generate a ROR signal; an address counter 40 for counting to generate addresses for refresh within the DRAM in response to the CBR and ROR signals; and a reset circuit 30 for resetting the count value of the address counter 40 to a predetermined value under a specific signal condition.

The CBR detector 10 receives RAS and CAS signals. The output CBR signal of the CBR refresh detector 10 and the output ROR signal of the ROR detector 20 are inputted into a 2-input OR gate OR1, and the output of the OR gate OR1 is in turn inputted into the address counter 40 as a clock signal at a CK terminal. The output of the reset circuit 30 is inputted into a direct clearing terminal CD of the address counter 40.

When the reset circuit 30 detects a special sequence of signals (e.q., CBR refresh→CBR refresh→RAS only refresh (ROR)), it generates a reset signal, and applies it to the CD terminal of the refresh counter 20, thereby resetting the refresh counter. In this situation, the refresh counter can be set to an arbitrarily selected value. If a CBR refresh signal or a RAS only refresh signal (i.e., ROR) is detected thereafter, the count value of the address counter 40 is incremented by one 1.

Figure 6:
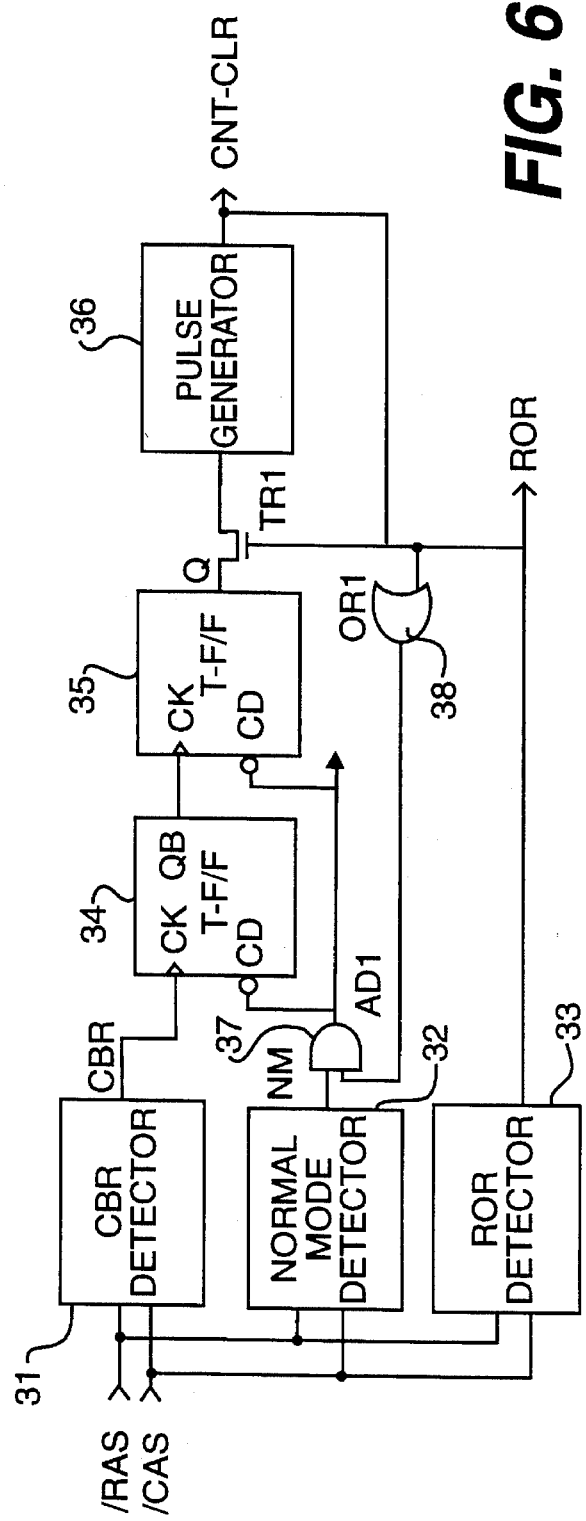
FIG. 6 is a block diagram of the reset circuit of FIG. 5.

FIG. 6 is a block diagram of the reset circuit 30 of the FIG. 5. This reset circuit, as embodied herein, is constructed such that when the signals are encountered in the sequence of CBR refresh→CBR refresh→ROR refresh, the reset circuit 30 applies a reset signal to the address counter 40 at CD to reset the count value thereof. FIG. 6 shows only one configuration of the reset circuit 30. It can be constructed in several different configurations.

Referring to FIG. 6, the reset circuit 30, as embodied herein, includes a CBR detector 31 for receiving RAS and CAS signals; a normal mode detector 32; and a ROR detector 33; first and second T-F/Fs 34 and 35 which are connected in cascade and which can be reset through clear direct terminal CD; a pulse generator 36; a 2-input OR gate OR1 38; a 2-input AND gate AD1 37; and a NMOS transistor TR1.

An output signal CBR of the CBR detector 31 is applied to a clock CK terminal of the first T-F/F 34, an inverted output signal QB of the first T-F/F 34 is applied to the second T-F/F 35 as clock input. A non-inverted output signal Q of the second T-F/Fs is applied, through the NMOS transistor TR1, to the pulse generator 36. The CD input terminal of each of the first and second T-F/Fs receives the output of AD1.

AD1 receives the output of OR1 on one input and an output NM of the normal mode detector 32. The OR gate OR1 receives an output signal ROR of the ROR detector 33 on one input and an output signal CNT-CLR of the reset circuit 30 on another input.

The output Q of the second T-F/F is inputted to the drain of the NMOS transistor TR1. The gate of the NMOS transistor TR1 is connected to the ROR signal, and its source is connected to the input terminal of the pulse generator 36.

The operation of the reset circuit 30 is carried out in the following manner. If the sequence of signals is a CBR refresh→ CBR refresh→RAS only refresh (ROR), then the reset circuit 30 generates the reset signal CNT-CLR. However, in other sequences, for example, if the sequence is a CBR refresh→RAS only refresh→ CBR refresh, or if the sequence is a normal operation mode→ CBR refresh→ normal mode→RAS only refresh→CBR refresh, the reset signal CNT-CLR is not generated.

However, the reset circuit 30 can be constructed differently in that the reset signal CNT-CLR can be generated for the sequence which is different than the sequence of CBR refresh→ CBR refresh→RAS only refresh. For example, the reset circuit 30 can be configured to generate the reset signal CNT-CLR when the sequence is a CBR refresh→RAS only refresh; a CBR refresh→ RAS only refresh→CBR refresh, a normal mode→CBR refresh→ normal mode→RAS only refresh→CBR refresh.

Referring to FIG. 6, when the CBR detector 31 detects a CBR refresh, the CBR detector 31 generates the CBR output signal in the sequence of low→high→low, and the CBR output signal is inputted into the first T-F/F 34 as clock CK. The normal mode detector circuit 32 performs the function of clearing both the first and second T-F/Fs with the sequence of high→low→high signals.

When the circuit is under the CBR refresh mode initially, the CBR output signal is generated to shift the inverted output QB of the first T-F/F 34 from low to high. Then the non-inverted output Q of the second T-F/F 35 is shifted from low to high, and the RAS only refresh (ROR) signal is generated (low→high→ low) to activate (turn on) the NMOS transistor TR1. Then the output Q of the second T-F/F 35 is applied to the pulse generator 36. When the pulse generator 36 finds, by detecting the rising edge of the signal, that its input is shifted from low to high, it generates an output sequence of high→low→high. When the reset signal CNT-CLR is high, if NM is high, then both the first and second T-F/Fs 34 and 35 are reset.

Figure 7:
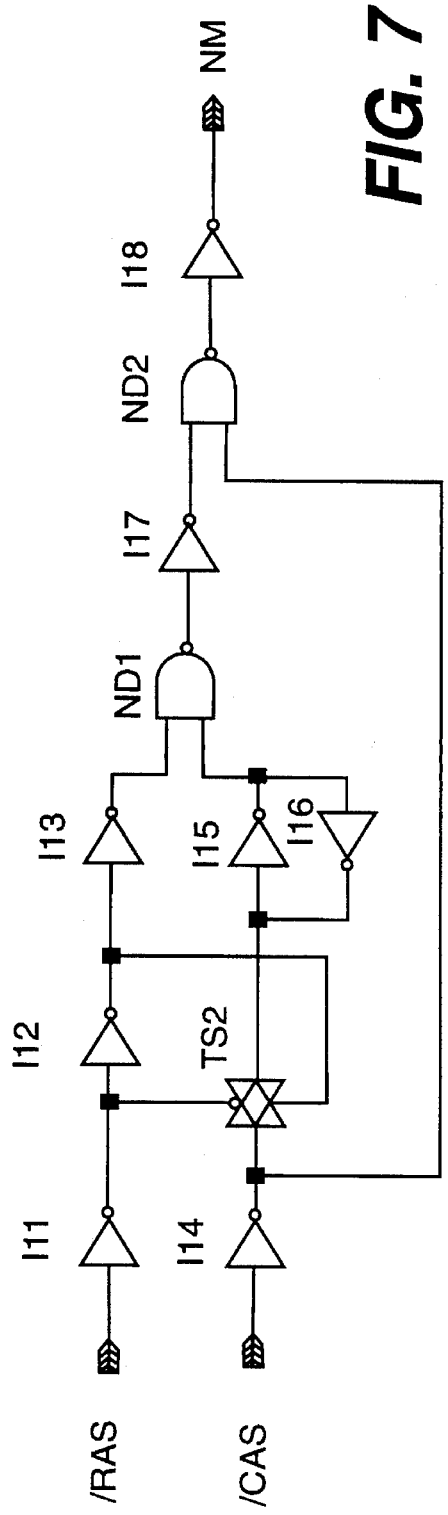
FIG. 7 is a circuit schematic of the normal mode detector of FIG. 6.

FIG. 7 is a circuit schematic of the normal mode detector 32 of FIG. 6. Unlike in the CBR refresh mode, when the normal mode detector 32 detects that the RAS signal, which is externally applied thereto, is shifted from high to low, and subsequently, the CAS signal, which is also externally applied thereto, is shifted from high to low, the RAS signal passes through invertors I11, I12 and I13 to be inputted into a NAND gate ND1 on one input. Likewise, the CAS signal passes through an I14, TS2 and I15 to be inputted into the NAND gate ND1 on another input.

The output of the invertor I11 is inputted into a PMOS gate of a transmission gate TS2, while the output of the invertor I12 is inputted into an NMOS gate of the transmission gate TS2. A NAND gate ND2 receives the output of invertors I17 and I14, and the output of the NAND gate ND2 is inputted into an invertor I18. The invertor I18 outputs the signal NM (which is also shown in FIG. 6).

The normal mode detector 32 operates in the following manner. If both the RAS and CAS signals are high, the outputs of the invertors I11 and I13 becomes low, while the output of the invertor I12 becomes high. Therefore, the output of the NAND gate ND1 becomes high, and the output of the invertor I17 becomes low, resulting that the output of the NAND gate ND2 becomes high and that the signal NM becomes low. In this situation, the output of the invertor I1 becomes low, and the output of the invertor I12 becomes high, resulting that TS2 is turned on.

Therefore, if the CAS signal is high, the output of the invertor I14 becomes low, and the output of the invertor I15 becomes high. Further, if the CAS signal is low, the output of the invertor I14 becomes high, and the output of the invertor I15 becomes low. That is, when the RAS is high, the output of the invertor I15 has the same value as that of the CAS. When the CAS is high, the NAND gate ND1 becomes high. Further, the output of the invertor I17 becomes low, and the output of the NAND gate ND2 stays high, while the output of the signal NM becomes low.

In this situation, if the RAS is shifted from high to low, the output of the invertors I11 and I13 become high. If the output of the invertor I12 is low, the TS2 is turned off, while the output value of the NAND gate ND1 is determined in accordance with the output value of the invertor I15. When the CAS is high, the output of the invertor becomes high, while the output of the NAND gate ND1 is shifted from high to low. When the NAND gate ND1 is shifted to low, the output of the invertor I17 becomes high.

Further, since the CAS is high, the output of the invertor I14 becomes low, so that the output of the NAND gate ND2 is maintained high without shifting. Thereafter, if the CAS is shifted from high to low (normal mode), the output of the invertor I14 is shifted to high, while the output of the NAND gate ND2 is shifted to low. Therefore, the signal NM becomes high, thereby detecting the normal mode. Then if both the CAS and RAS become high, the NAND gate ND2 is shifted from low to high, while the signal NM becomes low.

If the CAS becomes low before the RAS does, then the output of the invertor I15 is shifted to low, the output of the NAND gate ND1 is shifted to high, and the output of the invertor I17 becomes low. Since the CAS is low, the output of the invertor I14 becomes high, so that the output of the NAND gate ND2 stays high without shifting. Therefore, if the CAS becomes low before the RAS (i.e., CBR mode), then the NAND gate ND2 is maintained high, while the signal NM becomes low.

Meanwhile, if the CAS is maintained high continuously (i.e., ROR mode), then the output of the NAND gate ND2 is maintained high, while the signal NM, which has been maintained high and which has been inverted by the invertor I18, becomes low.

Figure 8:
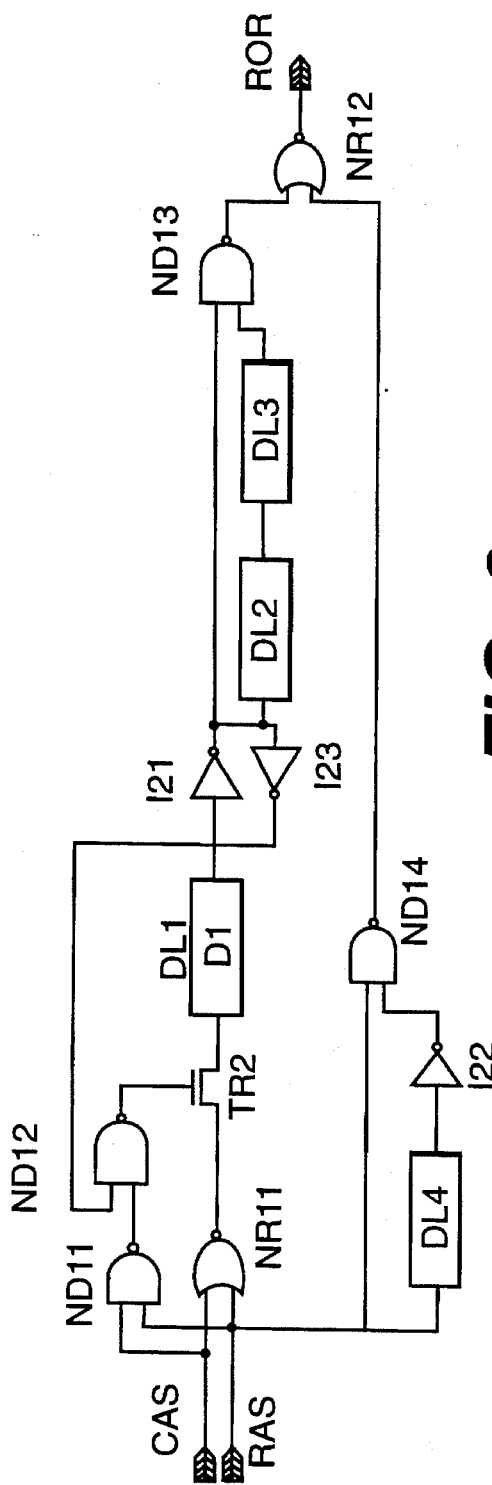
FIG. 8 is a circuit schematic of the ROR detector of FIG. 5.

FIG. 8 shows a block diagram of the ROR detector 33 of FIG. 6. In the RAS only refresh (ROR) sequence, during the time when the RAS is shifted in the sequence of high→ low→high, the CAS is maintained high continuously. The detection of the ROR signal is carried out in such a manner that a pulse is outputted during the time when the RAS is shifted from low to high. The RAS signal is supplied to the input terminals of a NAND gate ND11, NOR gate NR11, NAND gate ND14 and a delay line DL4, while the CAS signal is supplied to the input of ND11 and NR11. A NAND gate ND12 receives the output of ND11 and the output of DL1, while the output of ND12 is applied to the gate of a NMOS transistor TR2.

The output of ND12 is connected to the gate of TR2, and the drain of TR2 is connected to the output of NR1, while the source of TR2 is connected to the input of the DL1. The output of the DL1 is connected to the input of an invertor I21 and is fed back to the input of ND12. The output of I21 is connected to an input of a NAND gate ND13 and the input of a delay line DL2. The output of DL2 is connected to the input of a delay line DL3, and the output of DL3 is connected to another input of ND13. The output of ND13 is connected to an input of a NOR gate NR12.

The delay line DL4 receives the RAS signal, and the output of DL4 is connected to an invertor I22, and the output of I22 is connected to an input of a NAND gate ND14. The ND14 receives the RAS signal. The output of ND14 is applied to another input of NR12. The output of the NR12 generates ROR signals.

The operation of the ROR detector is carried out in the following manner. In this operation, the CAS is maintained high continuously, and only the RAS is shifted in the sequence of high→ low→high. Accordingly, when both the RAS and CAS are high, ND11 becomes low, while the rest of the signals become high. Further, NR11 becomes high only when both the RAS and CAS are low, and the rest of the signals are low.

If both the RAS and CAS are initially high, the output of ND11 becomes low, and the output of ND12 becomes high, turning on the transistor TR2. Since both the RAS and CAS are high, the output of NR11 becomes low. Further, since TR2 is turned on, the output of DL1 becomes low, and the output of I21 becomes high. Further, after a time delay associated with DL2 and DL3, the output of ND3 becomes low. When the RAS is high, the output of I22 becomes low. Therefore, the output of ND14 becomes high, while the output ROR of the NR12 becomes low.

If the CAS is continuously maintained high thereafter, the output of NR11 stays continuously low, and therefore, the output of ND13 stays low. When the RAS is shifted from high to low, the output of ND11 becomes high, but since the output of DL1 is low, the output of ND12 is maintained high. At the same time, the output of DL14 is shifted from high to low, while the output of I22 becomes high. However, since the RAS is low, the output of ND14 is maintained high. In this situation, if the RAS is shifted from low to high again, both inputs of ND14 become high, and therefore, the output of ND14 becomes low. At the same time, both inputs of NR2 become low, and therefore, the ROR becomes high.

After a time delay associated with DL4, if the output of I22 becomes low, then the output of ND14 becomes high, and the ROR becomes low (i.e., RAS only refresh). However, when the RAS is low, if the CAS becomes low, the output of NR11 becomes high, so that the output of DL1 becomes high, that the output of ND12 becomes low, and that TR2 is turned off. Since the output of DL1 is high, the output of I21 becomes low, and the output of ND13 becomes high. Therefore, even if the RAS inputted to ND14 is shifted from low to high, the output ROR of NR2 is maintained low.

Figure 9:
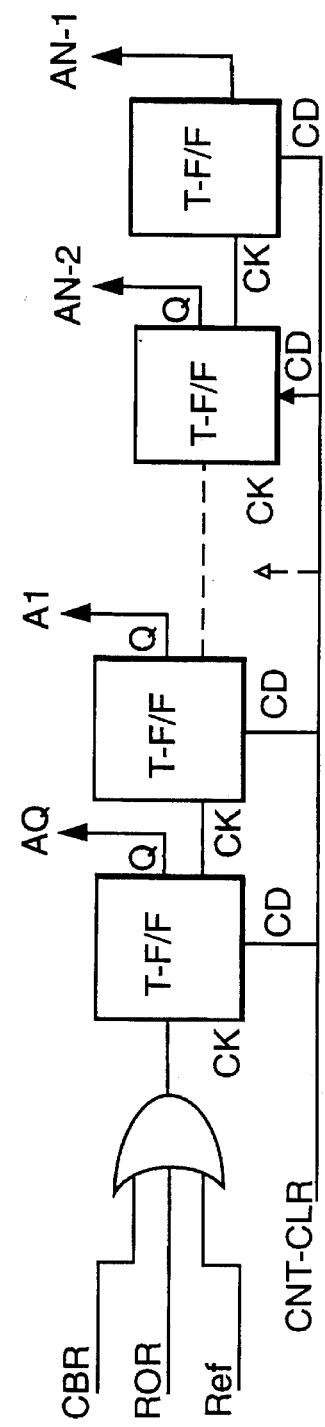
FIG. 9 is a circuit schematic of the address counter of FIG. 5.

FIG. 9 shows a block diagram of the address counter 40 of FIG. 5. Unlike a conventional address counter, this refresh counter comprises a plurality of flip-flops T-F/Fs connected in cascade. Each T-F/F has a clearing terminal CD connected to the reset control signal CNT-CLR. The clock signal is inputted into the first T-F/F through an OR gate. Refresh mode signals CBR, ROR, and Ref are inputted to the OR gate. Refresh mode signals other than CBR, ROR and Ref can also be provided to the OR gate. Each time when the CBR, ROR or Ref refresh mode signal is inputted, the address counter is incremented by one. Whenever the CNT-CLR signal is inputted into the CD terminal, the T-F/F is resetted.

Figure 10:
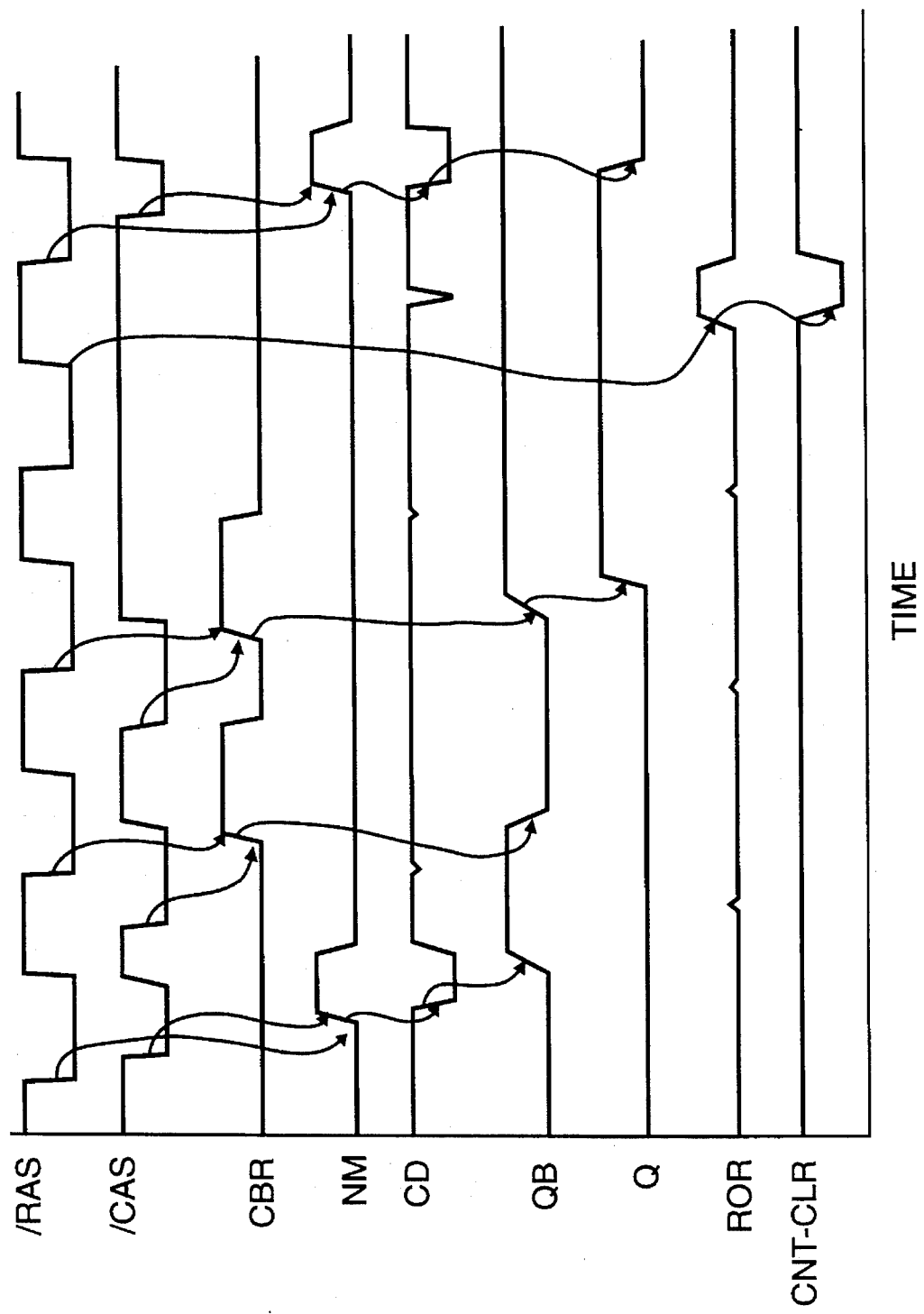
FIG. 10 is a timing chart associated with the operation of the DRAM refresh control circuit of FIG. 5.

FIG. 10 shows a timing chart associated with the operation of the control circuit of FIG. 5. Referring to the reset counter shown in FIG. 6, if the RAS is shifted from high to low, and the CAS is shifted from high to low, then this indicates a normal read/write operation mode. Then, such shifts are detected by the normal mode detector 32, and the signal NM is consequently generated to reset the first and second T-F/Fs of the reset circuit. Then if the CBR mode occurs, i.e., the CAS is shifted to low before the RAS is, the terminal QB of the first T-F/F becomes low. If the CBR mode occurs second time, the terminal QB of the first T-F/F is shifted from low to high, while the terminal Q of the second T/F-F becomes high. If the ROR mode occurs successively thereafter, the CNT-CLR signal is generated to clear the address counter.

In other words, referring to FIG. 6, when the CBR refresh mode is detected by the CBR detector, the CBR output signals in the form of pulses are generated in the sequence of low→high→ low. The CBR output signal is inputted into the first T-F/F as clock. When the CBR mode occurs first time, the CBR output signal is generated, so that the output QB of the first T-F/F is shifted from low to high, and then the RAS only refresh (ROR) signal is generated in the sequence of low→high→low. Consequently, the NMOS TR1 is turned on, so that the output of the second T-F/F is transmitted to the pulse generator 36. The pulse generator 36 generates an output in the sequence of high→ low→high, as the CNT-CLR pulse to reset the counter, when the input of the pulse generator is shifted in the sequence of low→ high.

As described above, in the conventional refresh control circuit, in the case of the RAS only refresh, refresh addresses have to be externally provided. In the case of the CBR hidden refresh, when an internal address counter for refresh addresses is utilized, the conventional circuit is incapable of externally supplying an arbitrarily selected value to reset the address counter to such a value.

The refresh control circuit of the present invention overcomes these problems, while allowing various refresh methods such as the DRAM RAS only refresh, the CBR refresh, and the hidden refresh and the like. For example, in the refresh control circuit of the present invention, the address counter for refresh addresses is set to an arbitrarily selected in that the address counter of the control circuit can be set to a same value as that of the system refresh counter. Therefore, the CBR refresh and the RAS only refresh can be used together.

More specifically, since the address counter (for refresh addresses) of the inventive refresh control circuit is capable of being incremented even under the RAS only refresh mode, when the address counter is reset, the system refresh address can be reset to the same value. Thereafter, the refresh address is incremented one by one upon every refresh, allowing the RAS only refresh method to be used in conjunction with other refresh methods.

It will be apparent to those skilled in the art that various modifications and variations can be made in the camera and method of the present invention without departing from the spirit or scope of the invention. Thus, it is intended that the present invention cover the modifications and variations of this invention provided they come within the scope of the appended claims and their equivalents.

For example, the above described refresh control circuit includes a CBR detector, ROR detector, reset circuit and counter for refresh addresses in one exemplary configuration. However, many different configurations for each of the CBR detector, ROR detector, reset circuit and address counter are possible without departing from the scope of the present invention.

What is claimed is:

1. A control circuit for refreshing a dynamic random access memory (DRAM) having a plurality of memory cells arranged in rows and columns, comprising:

a first means for detecting a first refresh mode in response to row and column address signals and for generating a first output signal;

a second means for detecting a second refresh mode in response to the row and column address signals and for generating a second output signal;

a third means for detecting said first refresh mode, said second refresh mode, and a normal mode in response to the row and column address signals and for generating a reset signal in response to the detected modes; and a counter means, coupled to said first, second, and third detecting means, for generating a count value representing a refresh address in response to said first and second output signals and said reset signal.

2. The refresh control circuit of claim 1, wherein said reset signal represents an arbitrarily selected value when said row and column address signals include a predetermined sequence of signals and wherein said counter means includes means for setting said count value to said selected value.

3. The refresh control circuit of claim 1, wherein said counter means includes means for incrementing said count value in response to said first and second output signals.

4. The refresh control circuit of claim 1, further comprising an OR logic gate between said first and second detecting means and said counter means for generating a clock signal in response to said first and second output signals.

5. The refresh control circuit of claim 1, wherein said third detecting means includes:

a first mode means for detecting said first refresh mode in response to the row and column address signals and for generating a first refresh mode signal;

a second mode means for detecting said second refresh mode in response to the row and column address signals and for generating a second refresh mode signal;

a normal mode means for detecting said normal mode in response to the row and column address signals and for generating a normal mode signal;

one or more flip-flops coupled to said first mode means and said normal mode means for generating a status signal in response to said first refresh mode signal and said normal mode signal; and means, coupled to said one or more flip-flops and said second mode means, for generating said reset signal in response to said status signal and said second refresh mode signal.

6. The refresh control circuit of claim 4, wherein said counter means includes means for incrementing said counted value in response to said generated clock signal.

7. The refresh control circuit of claim 5, wherein said one or more flip-flops include at least two flip-flops connected in cascade.

8. A method for controlling the refresh of a dynamic random access memory (DRAM) having a plurality of memory cells arranged in rows and columns, comprising the steps of:

detecting a first refresh mode in response to row and column address signals and generating a first output signal;

detecting a second refresh mode in response to the row and column address signals and generating a second output signal;

detecting said first refresh mode, said second refresh mode, and a normal mode in response to the row and column address signals and generating a reset signal; and counting a value representing a refresh address in accordance with said first and second output signals and said reset signal.

9. The method of claim 8, wherein said reset signal represents an arbitrarily selected value when said reset condition is detected.

10. The method of claim 8, wherein said counting step includes setting a counter to an arbitrarily selected value in response to said reset signal.

11. The method of claim 8, wherein said counting step includes incrementing a counter in response to said first and second output signals.

* * * * *